March 25, 1969 J. K. SKILLING 3,435,366

TUNNEL DIODE-TRANSISTOR BISTABLE AMPLIFIER CIRCUIT

Filed June 30, 1965

INVENTOR.
JAMES K. SKILLING
BY Rines and Rines
ATTORNEYS

United States Patent Office
3,435,366
Patented Mar. 25, 1969

3,435,366

TUNNEL DIODE-TRANSISTOR BISTABLE AMPLIFIER CIRCUIT

James K. Skilling, Harvard, Mass., assignor to General Radio Company, West Concord, Mass., a corporation of Massachusetts Filed June 30, 1965, Ser. No. 468,255
Int. Cl. H03f *21/00*
U.S. Cl. 330—69 10 Claims

ABSTRACT OF THE DISCLOSURE

The present disclosure deals with a pair of differentially connected transistor amplifiers having no feed-through path from the input to the output, but in the common input of which a tunnel diode is connected and is alternately switched between its high and low voltage states in response to successive input pulses, thereby causing the amplifiers to generate alternate bistable pulses in their respective outputs for such uses as high-speed switching at high repetition rates.

The present invention relates to bistable amplifier circuits and, more particularly, to tunnel diodes and similar-characteristic high- and low-voltage switching state devices (all hereinafter generically referred to as "tunnel diode" means) coupled to transistor or similar solid-state or other relay devices (hereinafter generically termed "transistor" means) to form improved bistable amplifier circuits.

One of the previously plaguing problems in the use of tunnel diodes and the like with transistor stages has resided in difficulties inherent in the coupling therebetween. The switching of a transistor relay from off to on, indeed, requires a voltage that generally is of the order of magnitude of, or greater than, the small approximately 0.45 volt voltage available in tunnel diode switching operations between its high- and low-voltage states, such that extremely critical biasing adjustments are required to enable operation, and these are often unstable under conditions of temperature variations. If the tunnel-diode-transistor coupling problem were susceptible of facile solution, however, a highly advantageous bistable amplifier circuit would result enabling very high speed switching and at very high repetition rates.

In accordance with the present invention, such coupling problems have indeed become obviated; the invention thus providing a new and improved bistable amplifier circuit.

A further object of the invention is to provide a novel tunnel-diode-transistor relay coupled circuit of more general utility, as well.

Other and further objects will be explained hereinafter and will be more particularly set forth in the appended claims. In summary, however, the invention contemplates a pair of differentially connected transistor amplifiers having no feed-through path from the input to the output, but in the common input of which a tunnel diode or the like is connected and is alternately switched between its high- and low-voltage states in response to successive input pulses, thereby causing the amplifiers to generate alternate bistable pulses in their respective outputs. Preferred constructional details are hereinafter set forth.

Figure 1:
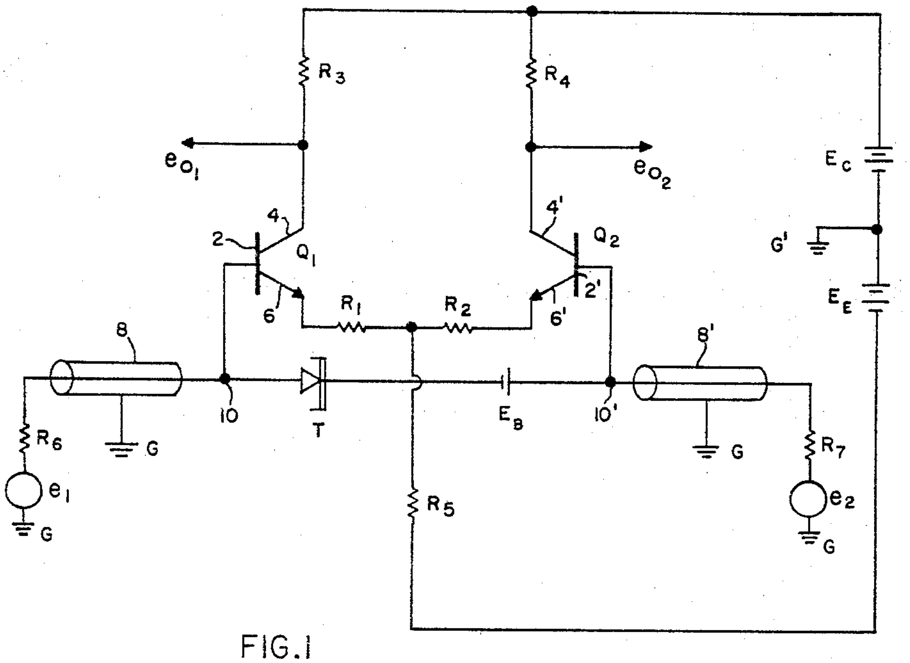
Figure 2:
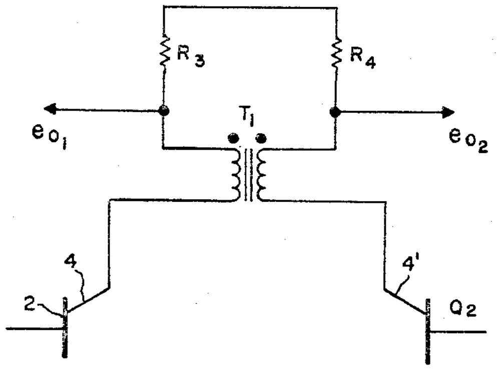

The invention will now be described in connection with the accompanying drawing, FIG. 1 of which is a schematic circuit diagram illustrating a preferred embodiment; and FIG. 2 is a modification thereof.

Referring to the drawing, a tunnel diode T is shown connected at its terminal 10 to the base 2 of the left-hand transistor stage $Q_1$ of a pair of differential transistor stages $Q_1$–$Q_2$, and through an adjustable bias source $E_B$, at terminal 10′, to the base 2 of the right-hand stage $Q_2$. The transistors $Q_1$ and $Q_2$ are selected to be as similar in characteristics as is feasible and they share in their common interconnected base input circuit the tunnel diode T and bias source $E_B$. To the respective terminals 10 and 10′ are applied short duration input pulses from respective impulse signal generators $e_1$ and $e_2$, by way of respective resistors $R_6$ and $R_7$ and preferably coaxial cable input lines 8 and 8′, the outer conductors of which are schematically shown grounded at G. The successive input pulses from the generators $e_1$ and $e_2$ cause the tunnel diode or similar device T to alternate between its high- and low-voltage states of operation in a bistable fashion.

The emitters 6 and 6′ of the stages $Q_1$ and $Q_2$ are, in accordance with the invention, connected together through respective resistors $R_1$ and $R_2$ and thence by common resistor $R_5$ to a common emitter potential source $E_E$, grounded at G′. The collectors 4 and 4′ are connected through respective resistors $R_3$ and $R_4$ to the collector voltage supply source $E_C$, also grounded at G′. By virtue of this circuit configuration, when the tunnel diode T is in its high-voltage state, $Q_1$ tends to draw a large collector current and $Q_2$ a small collector current. Conversely, when the tunnel diode T is in its low-voltage state, $Q_1$ draws a small, and $Q_2$ a large collector current. Thus amplified output voltages at $e_{o1}$ and $e_{o2}$ alternate bistably in response to the input-pulse switching of the diode T between its states of operation, with no feed-through path from the input of the differential amplifier $Q_1$–$Q_2$ to the separate collector outputs thereof at $e_{o1}$ and $e_{o2}$.

Extremely fast switching between well established states is thus achievable and at very high repetition rates; for example, repetition rates of one hundred to three hundred megacycles are attainable with switching times of the order of one nanosecond or less.

Unlike conventional flip-flop circuits, moreover, the input pulses appear as "common mode" signals to the amplifier $Q_1$–$Q_2$ and, in view of the lack of feed-through to the output from the input, are not present in the differential output signals at $e_{o1}$ and $e_{o2}$. Changes in the shape of the driving input pulses from $e_1$ and $e_2$, unlike in the case of conventional flip-flop and other bistable circuits, do not thus affect the output signals.

By matching the characteristics of the transistors or the like $Q_1$ and $Q_2$, furthermore, the turn-on knee criticality in transistor switching is eliminated, and direct coupling of the tunnel diode T to the transistors as at 10 and 10′ is feasible. Excellent impedance matching of the input pulses from $e_1$ and $e_2$ is also attainable, minimizing reflection problems. The spontaneously generated signal when the tunnel diode T switches states is also terminated.

In the event, however, that imbalances occur in the differential amplifier $Q_1$–$Q_2$ as a result of unbalanced transistor characteristics, the addition of a transformer $T_1$, preferably of bifilar form, in the collector circuits, FIG. 2, enhances the dynamic balance of the amplifier, resulting in substantially exactly complementary outputs at $e_{o1}$ and $e_{o2}$ and stability.

What is claimed is:

1. A bistable amplifier apparatus comprising, in combination, tunnel diode means having high and low-voltage states of operation, a pair of similar transistor means each having input and output circuite the former of which are interconnected to form a differential amplifier with the tunnel diode means connected between the input circuits, the output circuits having no path of feed-through from the input circuits, a pair of means for applying successive input pulses to the respective input circuits of the corresponding pair of transistor means to cause the tunnel diode means to alternate in response to successive input pulses between its high- and low-voltage states of operation, each of the transistor means correspondingly drawing alternately high and low current to produce alternate bistable output voltages in the said output circuits in response to the alternating states of operation of the tunnel diode means.

2. Apparaus as claimed in claim 1 and in which the input pulse applying means comprises coaxial cables fed from a pair of impulse signal generators.

3. Apparatus as claimed in claim 1 and in which the said interconnected input circuits provide a differential amplifier input responsive to the voltage of the tunnel diode means plus an adjustable bias voltage.

4. Apparatus as claimed in claim 1 and in which each of the differential amplifier trasnistor means is provided with base, collector and emitter electrodes, the bases being connected together through the tunnel diode means and a source of bias voltage and each being respectively connected to one of the pair of input-pulse applying means, the emitter electrodes being resistively connected to a common potential terminal, and the collector electrodes being connected to a common voltage source and providing separate alternate output voltages thereat.

5. Apparatus as claimed in claim 4 and in which the said input pulse applying means comprise coaxial cable connections from short-duration-pulse signal generators.

6. Apparatus as claimed in claim 4 and in which means is connected with the collector electrodes for rendering the said output voltages substantially exactly complementary in the event of imbalances in the characteristics of the said pair of similar transistor means.

7. Apparatus as claimed in claim 6 and in which the said rendering means comprises bifilar transformer means disposed in circuit with the said collector electrodes.

8. Apparatus as claimed in claim 1 and in which means is provided in the said output circuits for rendering the said output voltages substantially exactly complementary in the event of imbalances in the characteristics of the said pair of similar transistor means.

9. Apparatus as claimed in claim 8 and in which the said rendering mens comprises transformer means.

10. Amplifier apparatus comprising, in combinatoin, tunnel diode means provided with means for switching the same between high- and low-voltage states of operation, and a pair of differentially connected transistor amplifiers having an output and a common input containing the tunnel diode means, the amplifiers having no path of feed-through from the input to the output.

References Cited

UNITED STATES PATENTS

| | | |
|---|---|---|
| 3,262,066 | 7/1966 | Trilling. |
| 3,328,599 | 6/1967 | Stupar. |

NATHAN KAUFMAN, *Primary Examiner.*

U.S. Cl. X.R.

307—230; 330—30, 61, 30